(12) United States Patent
Takizawa et al.

(10) Patent No.: US 11,410,735 B2
(45) Date of Patent: Aug. 9, 2022

(54) MEMORY SYSTEM

(71) Applicant: KIOXIA CORPORATION, Tokyo (JP)

(72) Inventors: Kazutaka Takizawa, Yokohama Kanagawa (JP); Yoshihisa Kojima, Kawasaki Kanagawa (JP); Masaaki Niijima, Tokyo (JP)

(73) Assignee: KIOXIA CORPORATION, Tokyo (JP)

(*) Notice: Subject to any disclaimer, the term of this patent is extended or adjusted under 35 U.S.C. 154(b) by 0 days.

(21) Appl. No.: 17/038,721

(22) Filed: Sep. 30, 2020

(65) Prior Publication Data

US 2021/0241833 A1 Aug. 5, 2021

(30) Foreign Application Priority Data

Feb. 3, 2020 (JP) .............. JP2020-016264

(51) Int. Cl.
    *G11C 16/14* (2006.01)
    *G11C 16/26* (2006.01)
    *G11C 7/04* (2006.01)
    *G11C 16/32* (2006.01)
    *G11C 16/34* (2006.01)
    *G11C 16/30* (2006.01)

(52) U.S. Cl.
    CPC .............. *G11C 16/14* (2013.01); *G11C 7/04* (2013.01); *G11C 16/26* (2013.01); *G11C 16/30* (2013.01); *G11C 16/32* (2013.01); *G11C 16/3404* (2013.01)

(58) Field of Classification Search
    CPC .......... G11C 16/14; G11C 7/04; G11C 16/26; G11C 16/30; G11C 16/32; G11C 16/3404
    USPC ................................. 365/185.29
    See application file for complete search history.

(56) References Cited

U.S. PATENT DOCUMENTS

| 9,424,940 | B1 | 8/2016 | Choo et al. | |
| 9,922,714 | B1* | 3/2018 | Yu ...................... | G11C 16/0483 |
| 2016/0334992 | A1 | 11/2016 | Yashiro | |
| 2017/0285944 | A1* | 10/2017 | Wang ...................... | G06F 3/061 |

* cited by examiner

*Primary Examiner* — Xiaochun L Chen
(74) *Attorney, Agent, or Firm* — Kim & Stewart LLP

(57) ABSTRACT

A memory system includes a non-volatile memory chip and a controller. The non-volatile memory chip is capable of determining an erase voltage according to a temperature of the non-volatile memory chip and a correction parameter. The controller is configured to update the correction parameter of the non-volatile memory chip according to temperature information related to the temperature of the non-volatile memory chip. The non-volatile memory chip determines the erase voltage according to the temperature of the non-volatile memory chip and the updated correction parameter received from the controller.

14 Claims, 12 Drawing Sheets

MEMORY SYSTEM

CROSS-REFERENCE TO RELATED APPLICATION

This application is based upon and claims the benefit of priority from Japanese Patent Application No. 2020-016264, filed Feb. 3, 2020, the entire contents of which are incorporated herein by reference.

FIELD

Embodiments described herein relate generally to a memory system.

BACKGROUND

In a memory system including a non-volatile memory chip, operating characteristics of the non-volatile memory chip may vary depending on temperature. Even under conditions where temperature is varying, it is desired that a data erase operation be appropriately performed in the non-volatile memory chip.

DETAILED DESCRIPTION

Figure 1:
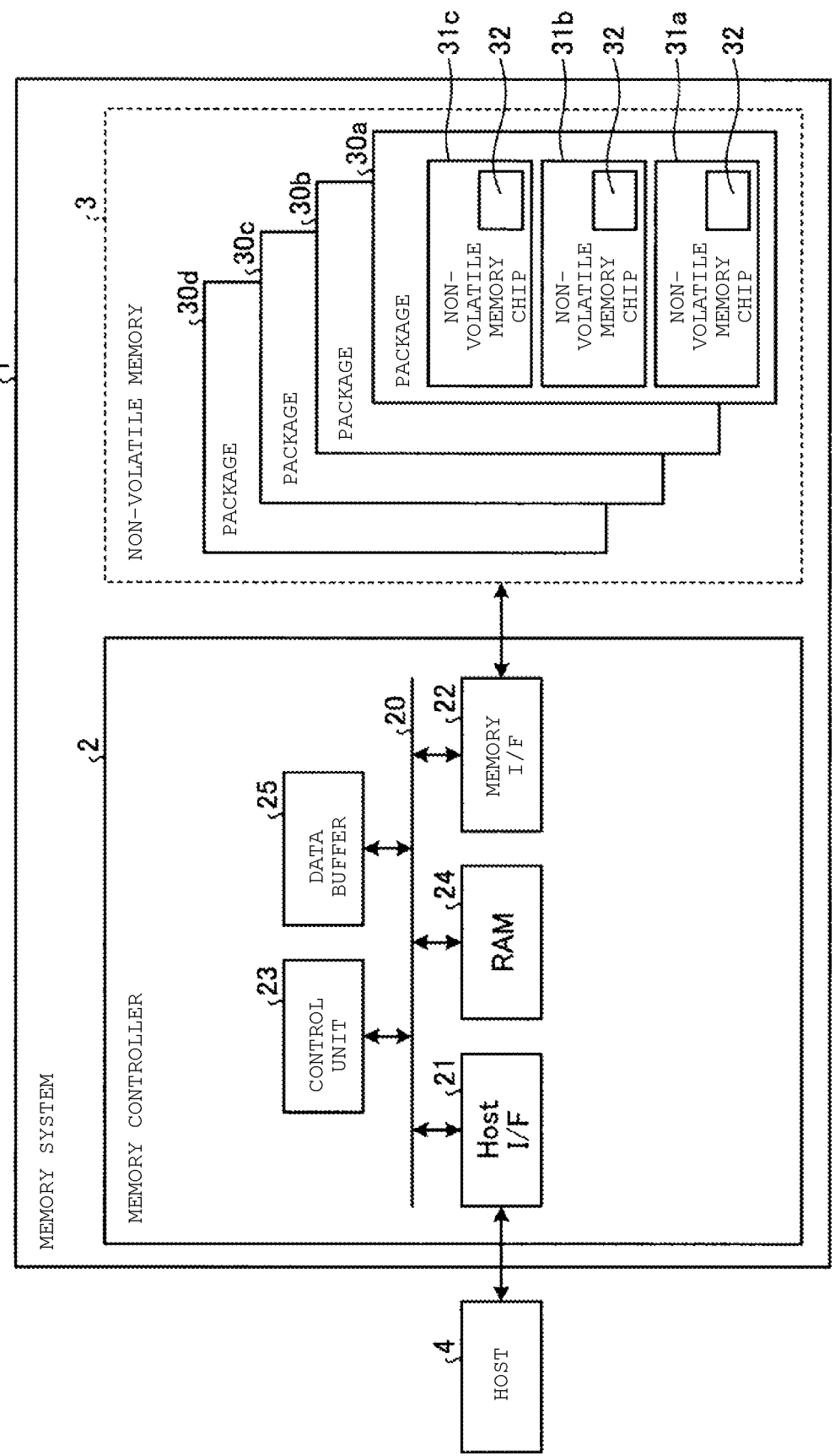
FIG. 1 is a diagram illustrating a configuration of a memory system according to an embodiment.

Embodiments provide a memory system capable of optimizing a data erase operation in a non-volatile memory chip.

In general, according to one embodiment, there is provided a memory system including a non-volatile memory chip and a controller. The non-volatile memory chip is capable of determining an erase voltage according to a temperature of the non-volatile memory chip and a correction parameter. The controller is configured to update the correction parameter of the non-volatile memory chip according to temperature information related to the temperature of the non-volatile memory chip. The non-volatile memory chip determines the erase voltage according to the temperature of the non-volatile memory chip and the updated correction parameter received from the controller.

Hereinafter, a memory system according to an embodiment will be described in detail with reference to the accompanying drawings. Embodiments of the present disclosure are not limited to this embodiment.

Embodiment

The memory system according to the embodiment includes a plurality of non-volatile memory chips. Operating characteristics of each non-volatile memory chip may vary depending on temperature. Consequently, in each non-volatile memory chip, it is desired that a data erase operation be robust against temperature variations and the data erase operation be appropriately performed.

In the non-volatile memory chip, an erase voltage changes as the temperature of the non-volatile memory chip varies. The non-volatile memory chip has a function of correcting the erase voltage according to the temperature. For example, in the initial state, a common correction function for correcting a value of the erase voltage according to the temperature is set in each non-volatile memory chip. If correction parameters of the correction function of the erase voltage set in the non-volatile memory chip are the same between the chips, it may not be possible to appropriately follow the temperature change when there are large variations in the characteristics between the chips. For example, an appropriate correction value cannot be set in each non-volatile memory chip, resulting in insufficient erasing or excessive erasing in the data erase operation.

In the memory system, a plurality of non-volatile memory chips and a controller chip may be packaged and mounted on a circuit board. In a system in which a plurality of electronic components are mounted on the board, the temperature of the electronic components may differ depending on a mounting position of each electronic component on the board. The memory system is no exception, and a temperature difference of each non-volatile memory chip depending on the mounting position may be so large that the temperature difference cannot be ignored.

For example, in a memory system, a controller chip including a controller may serve as a heat source. For that reason, in a non-volatile memory chip close to the controller chip, the chip temperature tends to be relatively high, and in a non-volatile memory chip far from the controller chip, the chip temperature tends to be relatively low. With this configuration, in the memory system, a difference in temperature depending on the mounting position is likely to occur.

The non-volatile memory chips differ in the degree to which the non-volatile memory chips are subjected to heat stress due to the difference in mounting position, and due to the influence, an appropriate correction value in accordance with the temperature may deviate from that obtained by a common correction function by different amounts. For that reason, if the erase voltage is corrected by the correction function that is commonly applied to the non-volatile memory chips, erase characteristics may vary among the chips, and erasing may be insufficient or excessive in some non-volatile memory chips.

Therefore, in this embodiment, the correction parameter that defines the correction function of the non-volatile memory chip is updated according to temperature information related to the temperature of the non-volatile memory chip to reduce variations in the erase characteristics between the chips.

Specifically, an algorithm for measuring fluctuation in the correction value of the erase voltage of the non-volatile memory chip due to heat stress and compensating for the fluctuation is introduced into the memory system. That is, the non-volatile memory chip has a correction function defined by the correction parameter, and can correct the erase voltage by applying the temperature to the correction function. The controller measures the temperature information related to the temperature of the non-volatile memory chip and applies the temperature information to a model function to obtain a deviation amount from an appropriate value of the erase voltage. The temperature information may be, for example, a difference between the temperature of the chip at the previous data erase operation and the current temperature of the chip. The difference can also be regarded as information about heat stress. Then, the controller obtains an update amount of the correction parameter corresponding to the difference and controls the non-volatile memory chip to update the correction parameter with the update amount. In response, the non-volatile memory chip corrects the erase voltage on the basis of the temperature and the updated correction parameter. For example, the non-volatile memory chip applies the temperature measured by the chip to a correction function defined by the updated parameter to correct the erase voltage. With this configuration, the correction parameter of each non-volatile memory chip can be updated to an appropriate value in accordance with the temperature information and the erase voltage can be corrected to an appropriate value, and thus variations in the data erase operation among the non-volatile memory chips can be reduced.

More specifically, the memory system 1 can be configured as illustrated in FIG. 1. FIG. 1 is a block diagram illustrating a schematic configuration example of the memory system 1 according to the embodiment. As illustrated in FIG. 1, the memory system 1 includes a memory controller 2 and a non-volatile memory 3. The non-volatile memory 3 in this embodiment is a NAND flash memory, but is not limited thereto.

The memory system 1 may be a memory card or the like in which the memory controller 2 and the non-volatile memory 3 are configured as one package, or a solid state drive (SSD) or the like. The memory system 1 can be connected to a host 4. The host 4 may be, for example, an information processing apparatus such as a personal computer, a server, a storage box, a mobile phone, an imaging device, a mobile terminal such as a tablet computer or a smartphone, a game device, or an in-vehicle terminal such as a car navigation system.

The non-volatile memory 3 stores data in a non-volatile manner. The following describes a case where a two-dimensional (planar) structure flash memory is used as the non-volatile memory 3, but the example of the non-volatile memory 3 is not limited thereto. The non-volatile memory 3 may be, for example, a flash memory having a three-dimensional structure.

The non-volatile memory 3 includes one or more packages 30a to 30d. Although four packages 30a to 30d are illustrated in FIG. 1, the number of packages 30a to 30d is not limited to four, and may be one or more. When the individual packages 30a to 30d are not distinguished from one another, the packages are also simply referred to as a package 30.

Each of the packages 30 includes one or more non-volatile memory chips 31a to 31c. Although three non-volatile memory chips 31a to 31c are illustrated in FIG. 1, the number of non-volatile memory chips 31a to 31c is not limited to three, and may be one or more. When the individual non-volatile memory chips 31a to 31c are not distinguished from one another, the non-volatile memory chips are also simply referred to as a non-volatile memory chip 31.

Each of the non-volatile memory chips 31 includes a temperature sensor 32 for measuring the temperature of the non-volatile memory chip 31. The temperature sensor 32 transmits the measured temperature of the non-volatile memory chip 31 to the memory controller 2 as temperature information in response to a temperature acquisition command from the memory controller 2, for example.

The memory controller 2 is a semiconductor integrated circuit configured as, for example, a system-on-a-chip (SoC). Some or all of various functions of the memory controller 2 may be implemented by a CPU that executes firmware or by a dedicated hardware circuit. The memory controller 2 controls writing to the non-volatile memory 3 according to a write command from the host 4. The memory controller 2 controls reading from the non-volatile memory 3 according to a read command from the host 4.

The memory controller 2 includes a host interface (host I/F) 21, a memory interface (memory I/F) 22, a control unit 23, a random access memory (RAM) 24, and a data buffer 25. The host I/F 21, the memory I/F 22, the control unit 23, the RAM 24, and the data buffer 25 are connected to each other by an internal bus 20.

The host I/F 21 performs a process in compliance with an interface standard with the host 4, and outputs an access command (also referred to as an instruction), data to be written (e.g., user data), and the like received from the host 4 to the internal bus 20. The interface standard is, for example, a peripheral component interconnect express (PCIe)®, serial attached SCSI (SAS), or serial advanced technology attachment (SATA). The host I/F 21 also transmits data (e.g., user data) read from the non-volatile memory 3, a response from the control unit 23, and the like, to the host 4.

The memory I/F 22 performs a write operation into the non-volatile memory 3 based on an instruction of the control unit 23. The memory I/F 22 performs a read operation from the non-volatile memory 3 based on an instruction of the control unit 23.

The data buffer 25 temporarily stores data received from the host 4 by the memory controller 2 until the data is stored in the non-volatile memory 3. The data buffer 25 temporarily stores data read from the non-volatile memory 3 until the data is transmitted to the host 4. For the data buffer 25, for example, a general-purpose memory such as a static random access memory (SRAM) or a dynamic random access memory (DRAM) may be used.

The control unit 23 includes, for example, a central processing unit (CPU). The control unit 23 operates based on firmware. The firmware is stored for example in the non-volatile memory 3 when the memory system 1 is manufactured or shipped. The control unit 23 loads the firmware from the non-volatile memory 3 into the RAM 24 in the memory controller 2 at start up. The control unit 23 provides various functions by executing the firmware loaded into the RAM 24.

Figure 2:
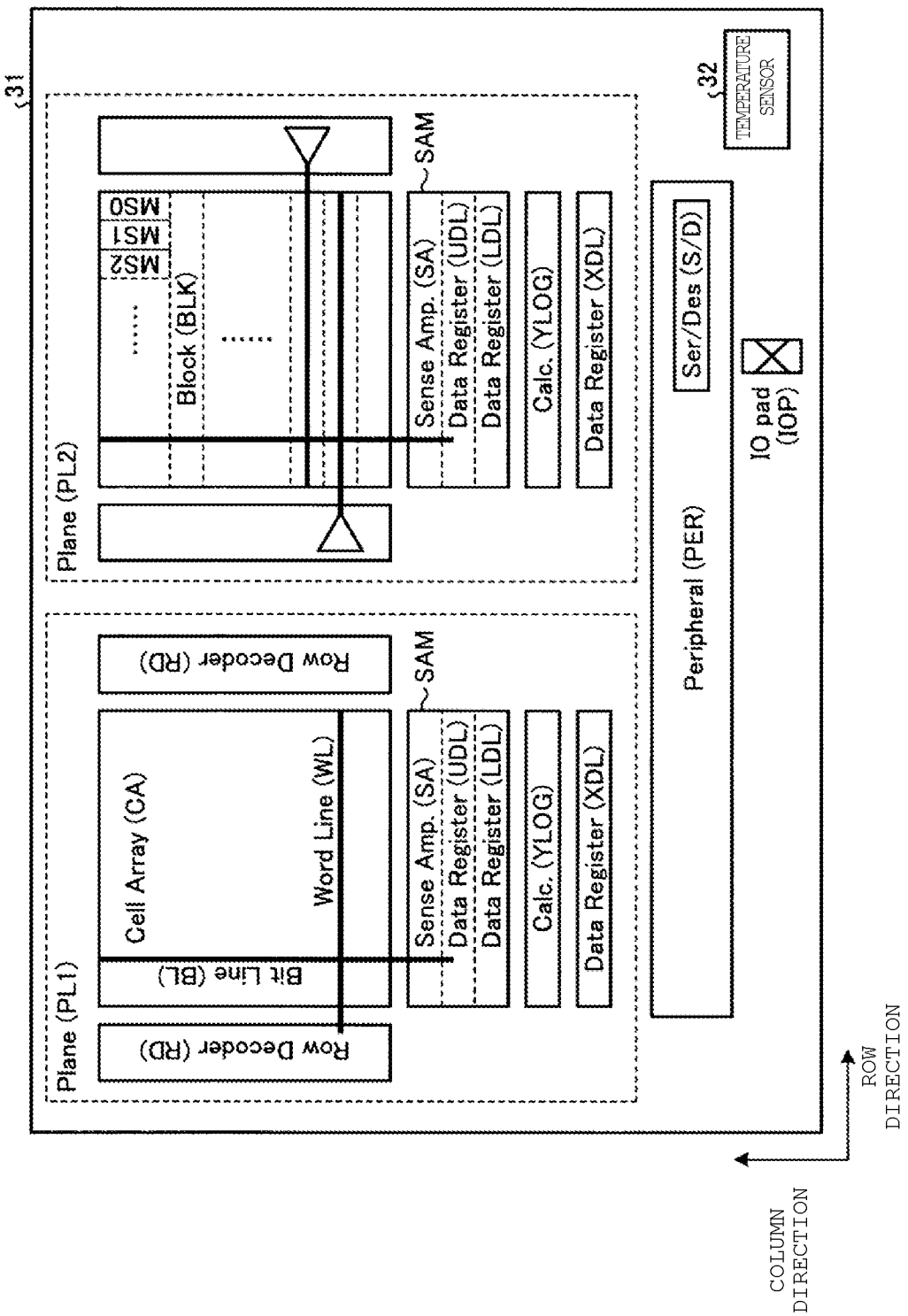
FIG. 2 is a diagram illustrating a configuration of a non-volatile memory chip in the embodiment.

FIG. 2 is a block diagram illustrating a configuration example of the non-volatile memory chip 31 in the non-volatile memory 3 according to the embodiment. Each of the non-volatile memory chips 31a to 31c of the embodiment has the same configuration.

As illustrated in FIG. 2, the non-volatile memory chip 31 includes planes PL1 and PL2, a peripheral circuit PER, and an input and output pad IOP, for example. The number of planes PL1 and PL2 in the non-volatile memory chip 31 is not limited to two, and may be three or more. When the individual planes PL1 and PL2 are not distinguished from each other, the planes are also simply referred to as a plane PL. Each of the planes PL includes a cell array CA, a row decoder RD, a sense amplifier module SAM, an arithmetic circuit YLOG, and a data register XDL.

The cell array CA includes a plurality of blocks (in particular, a plurality of physical blocks) BLK which is a set of non-volatile memory cells. The block BLK serves as a unit of a data erase operation, and all data in the same block BLK are erased collectively. Each of the blocks BLK includes a memory string MS (MS0, MS1, MS2 in which memory cells are connected in series.

Each memory cell is disposed at a point where each of a plurality of bit lines BL and each of a plurality of word lines WL intersect. Each memory cell is connected to one of the plurality of bit lines BL extending in a column direction with a certain pitch in a row direction. Each memory cell is connected to one of the plurality of word lines WL extending in the row direction with a certain pitch in the column direction.

The row decoder RD decodes a block address instructed by the control unit 23 and selects the corresponding block BLK.

The sense amplifier module SAM includes a plurality of sets of a sense amplifier SA and data registers UDL and LDL. The sense amplifier SA and the data registers UDL and LDL are connected to each other by a bus (not illustrated). The sense amplifier SA is provided for each bit line BL, senses and amplifies data read onto the corresponding bit line BL, and transfers write data onto the corresponding bit line BL. The data registers UDL and LDL temporarily store data.

The arithmetic circuit YLOG performs an arithmetic operation for the data stored in the data registers UDL and LDL.

The data register XDL is provided for each bit line BL and temporarily stores data related to the corresponding bit line BL. The data register XDL may be used as a buffer of the non-volatile memory 3. That is, even when the data registers UDL and LDL inside the sense amplifier module SAM are in use, if the data register XDL is available, the non-volatile memory 3 can receive data from the outside.

The input and output pad IOP supports communication of various commands and data with the memory controller 2.

The peripheral circuit PER includes a serializer/deserializer S/D, a sequencer (not illustrated), a charge pump, a register, a driver, and the like. The serializer/deserializer S/D converts data or the like sent in a serial signal format from the outside such as the memory controller 2 into a parallel signal. The serializer/deserializer S/D converts data and the like handled in a parallel signal format in the non-volatile memory chip 31 into a serial signal. The serializer/deserializer S/D selects a bit line BL of the cell array CA.

The driver supplies a voltage required for writing, reading, and erasing data to the row decoder RD, the sense amplifier SA, and a source line driver (not illustrated) under the control of the sequencer which receives a command from the memory controller 2. The charge pump boosts a power supply voltage given from the outside and supplies the necessary voltage to the driver. The register stores various signals. The sequencer controls the operation of the entire non-volatile memory 3.

Figure 3:
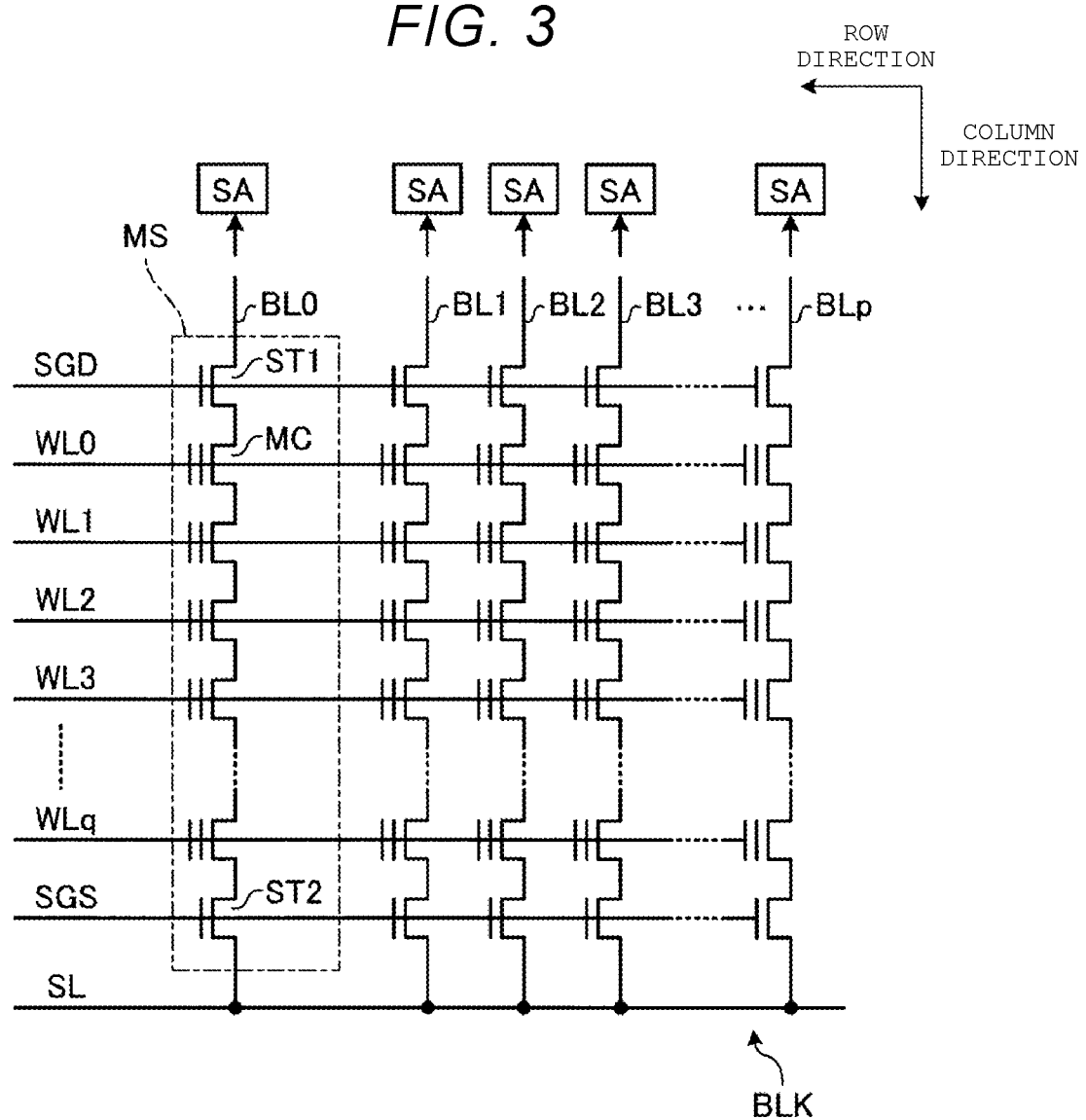
FIG. 3 is a diagram illustrating a configuration of a cell array in the embodiment.

FIG. 3 is a circuit diagram illustrating a configuration example of one block BLK in the non-volatile memory chip 31 of the non-volatile memory 3 according to the embodiment.

Each block BLK includes (p+1) memory strings MS (p is an integer of 0 or more) arranged in order along the row direction.

Each memory string MS includes select transistors ST1 and ST2. The drains of the select transistors ST1 are connected to the bit lines BL0 to BLp and the gates thereof are commonly connected to a select gate line SGD. The sources of the select transistors ST2 are commonly connected to a source line SL, and the gates thereof are commonly connected to a select gate line SGS.

Each memory cell MC is implemented by a metal oxide semiconductor field effect transistor (MOSFET) having a stacked gate structure formed on a semiconductor substrate. The stacked gate structure includes a charge storage layer formed on a semiconductor substrate with a gate insulating film interposed, and a control gate electrode formed on the charge storage layer with an inter-gate insulating film interposed. The memory cell MC has a threshold voltage that changes according to the number of electrons stored in the charge storage layer, and stores data of different values according to the different levels in the threshold voltage. The memory cell MC may be configured as a single-level cell (SLC) in which 1-bit information is recorded in each cell, a multi-level cell (MLC) in which 2-bit information is recorded in each cell, or a triple-level cell (TLC) in which 3-bit information is recorded in each cell.

In each memory string MS, (q+1) memory cells MC are disposed between the source of the select transistor ST1 and the drain of the select transistor ST2 so that current paths of the (q+1) memory cells MC are connected in series (q is an integer of 0 or more). That is, a plurality of memory cells MC are connected in series in the column direction so that adjacent ones share a diffusion region (source region or drain region).

In each memory string MS, control gate electrodes are respectively connected to word lines WL0 to WLq in order from the memory cell MC positioned nearest to the select gate line SGD. Accordingly, the drain of the memory cell MC connected to the word line WL0 is connected to the source of the select transistor ST1, and the source of the memory cell MC connected to the word line WLq is connected to the drain of the select transistor ST2.

The word lines WL0 to WLq are commonly connected to the control gate electrodes of the memory cells MC across the memory strings MS in the same block BLK. That is, the control gate electrodes of the memory cells MC on the same row in the block BLK are connected to the same word line WL. The (p+1) memory cells MC connected to the same word line WL are handled as a memory cell group corresponding to one or a plurality of pages (also referred to as physical pages). Data write and data read are performed for each physical page.

The bit lines BL0 to BLp are commonly connected to the drains of the select transistors ST1 of different blocks BLK. That is, the memory strings MS in the same column in the plurality of blocks BLK are connected to the same bit line BL.

Figure 4:
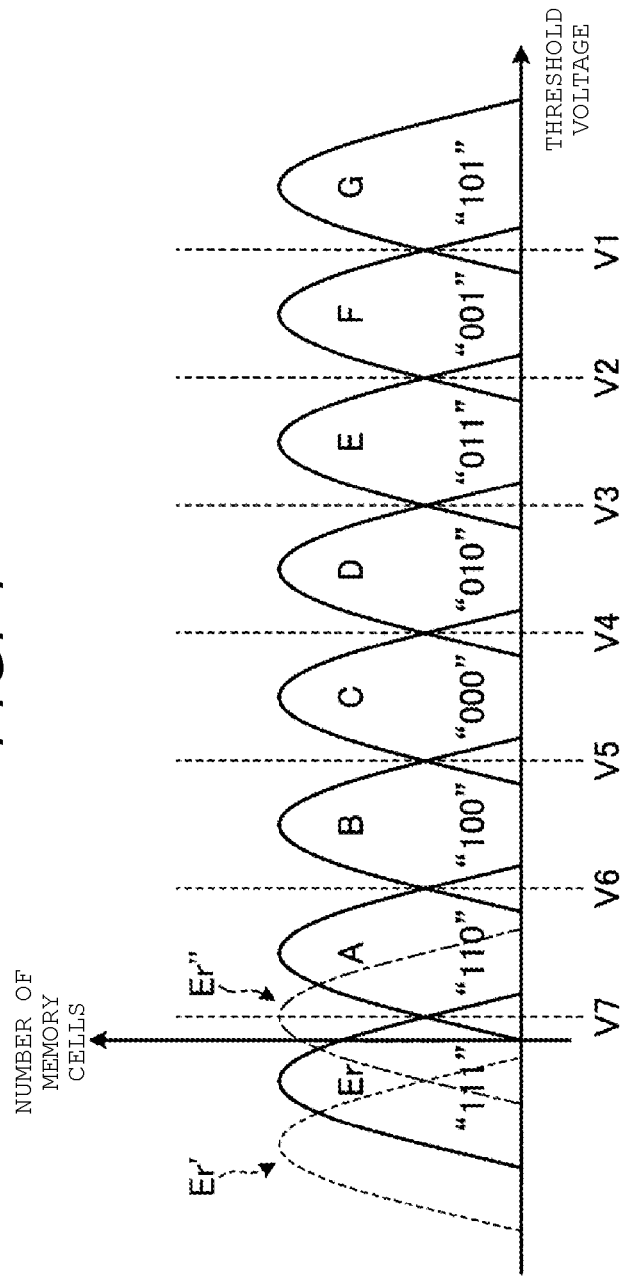
FIG. 4 is a diagram illustrating a threshold voltage distribution of memory cells according to the embodiment.

When each memory cell MC operates as a triple-level cell (that is, when each memory cell MC operates in a TLC mode), a threshold voltage distribution of the memory cells MC is as illustrated in FIG. 4, for example. FIG. 4 is a diagram illustrating the threshold voltage distribution of the memory cells MC according to the embodiment. In FIG. 4, the horizontal axis represents the threshold voltage, and the vertical axis represents the number of memory cells MC (specifically, the number of memory cells MC having a predetermined threshold voltage).

In the TLC mode, each memory cell MC can store 3-bit data "xyz" defined by data "x" belonging to an upper page, data "y" belonging to a middle page, and data "z" belonging to a lower page. The values of the data "x", the data "y", and the data "z" are "0" or "1". The threshold voltage of each memory cell MC is controlled so as to be in any one of the following eight states: Er state, A state, B state, C state, D state, E state, F state, and G state. The correspondence between each state and the data value of the 3-bit data "xyz" is preset. For example, data value "111" is assigned to the Er state. Data value "110" is assigned to the A state. Data value "100" is assigned to the B state. Data value "000" is assigned to the C state. Data value "010" is assigned to the D state. Data value "011" is assigned to the E state. Data value "001" is assigned to the F state. Data value "101" is assigned to the G state. The correspondence between each state and the data value is not limited to the correspondence described.

When a write command is received from the host 4, the memory controller 2 converts the write command into a command set that includes a row address and a column address. The serializer/deserializer S/D selects and activates a bit line BL corresponding to the column address specified in the command set. The sense amplifier SA sets a voltage of the bit line BL selected by the serializer/deserializer S/D to 0V. The row decoder RD applies a program pulse to a word line WL corresponding to the row address specified in the command set. Then, electrons are injected into the charge storage film of the memory cell MC positioned at the intersection of the selected bit line BL and the selected word line WL, and as a result, the threshold voltage of the memory cell MC rises. Each time the program pulse is applied, the sense amplifier module SAM checks whether the threshold voltage reaches a voltage in accordance with data stored in the data register XDL. The sense amplifier SA continues to apply the program pulse to the row decoder RD until the threshold voltage reaches the voltage level corresponding to the data to be stored.

When a read command is received from the host 4 via the memory controller 2, the sense amplifier module SAM precharges the bit lines BL with a bit line voltage Vb1 (for example, 1.5 V) and the row decoder RD sequentially applies a plurality of types of determination voltages (also referred to as read voltages) to the selected word line WL. The row decoder RD applies a read pass voltage to non-selected word lines WL and keeps the memory cells MC belonging to the non-selected word lines WL conductive. The sense amplifier SA determines a data value stored in the target memory cell MC by determining which read voltages cause the charges stored by the precharge to flow out to the source line SL.

As illustrated in FIG. 4, a read voltage V7 is set between the Er state and the A state. A read voltage V6 is set between the A state and the B state. A read voltage V5 is set between the B state and the C state. A read voltage V4 is set between the C state and the D state. A read voltage V3 is set between the D state and the E state. A read voltage V2 is set between the E state and the F state. A read voltage V1 is set between the F state and the G state.

In the example of FIG. 4, the tails of the threshold voltage distributions of the memory cells MC belonging to each of the states Er, and A to G are overlapped. That is, for example, the maximum value of the threshold voltage of the memory cells MC belonging to the A state exceeds the determination voltage V6, and the minimum value of the threshold voltage of the memory cells MC belonging to the B state is below the determination voltage V6. When a memory cell MC belonging to the A state and having a threshold voltage higher than the determination voltage V6 is read, the memory cell MC is recognized as belonging to the B state. That is, data written as "110" is read as "100". When a memory cell MC belonging to the B state and having a threshold voltage lower than the determination voltage V6 is read, the memory cell MC is recognized as belonging to the A state. That is, data written as "100" is read as "110".

An error due to the memory cell MC having a threshold voltage near the determination voltage can be corrected by an error correcting code (ECC) circuit or the like in the memory controller 2. However, there is a limit to the number of error bits that the memory controller 2 can correct by the ECC circuit. A voltage value that minimizes the number of memory cells MC in a portion where two adjacent states overlap may be used as the determination voltage so that the number of error bits in the read data does not exceed the limit. With this configuration, the number of errors in the read data can be reduced.

For example, among the plurality of states Er to G, the Er state illustrates a threshold voltage distribution in an erase state. In FIG. 4, the threshold voltage distribution in an appropriate erase state is illustrated by a solid line. When the erase state is indicative of excessive erasing, an Er' state shifted to a lower voltage side than the appropriate Er state may be formed as illustrated by a dotted line. In this case, the overlap between the Er state and the A state can be eliminated, but since the erase voltage is excessively applied to the memory cell, the memory cell is likely to deteriorate due to stress caused by the data erase operation.

When the erase state is indicative of insufficient erasing, an Er" state shifted to a higher voltage side than the appropriate Er state may be formed as illustrated by one-dot chain line. In this case, the overlap between the Er" state and the A state may become large, the number of error bits in the read data may exceed the limit of the number of correctable error bits, and the data may not be read appropriately from the memory cell.

On the other hand, even when the chip temperature changes in each non-volatile memory chip, if the erase voltage is corrected to an appropriate value by control of this embodiment, the erase characteristics can be made uniform among the non-volatile memory chips, and the threshold voltage distribution in the erase state can be maintained to the appropriate Er state illustrated by the solid line in FIG. 4. The degree of overlap of the Er state with the appropriate A state may be made substantially equal to the degree of overlap between two of the other states A to G. As a result, the number of errors in the read data can be reduced.

Figure 5:
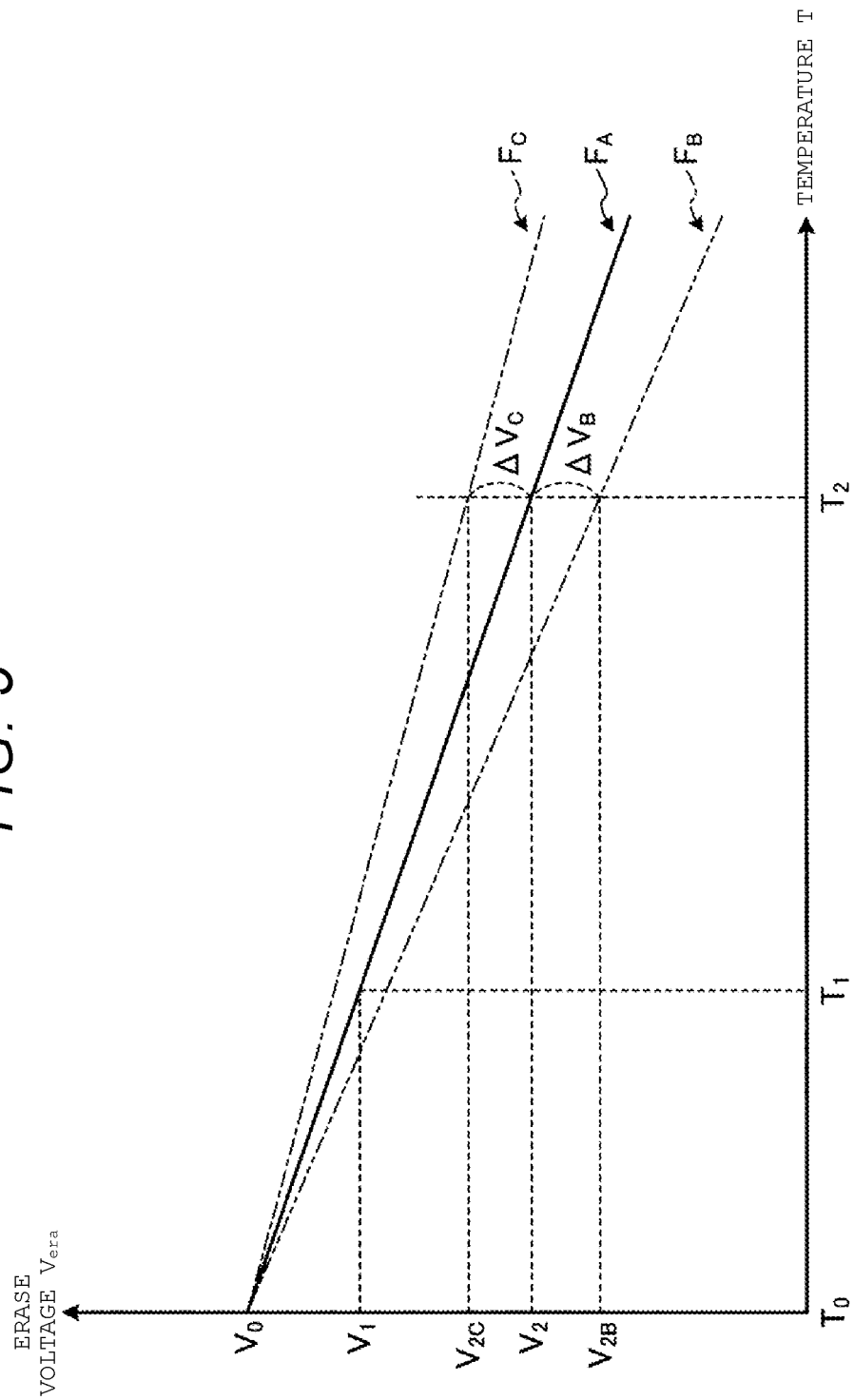
FIG. 5 is a graph illustrating a correction function used in the embodiment.

Next, the common correction function set in each non-volatile memory chip will be described with reference to FIG. 5. FIG. 5 is a graph illustrating the correction function set in each non-volatile memory chip. In FIG. 5, the vertical axis represents the erase voltage and the horizontal axis represents the temperature. The correction function is a function used to correct the erase voltage, and indicates the value of the erase voltage to be corrected according to the temperature.

Data in each memory cell tends to be more easily erased as the temperature rises. Accordingly, a common correction function $F_A$ set in each non-volatile memory chip is a linear function with respect to temperature and can be represented by a straight line. This straight line is, for example, as illustrated by a solid line in FIG. 5, a straight line having an erase voltage $V_0$ with respect to a reference temperature $T_0$ (for example, 0° C.), and a negative slope of $-C_0$ ($C_0$ is any positive number). For the erase voltage $V_{era}$ and the temperature T, the correction function $F_A(T)$ is a function defined by correction parameters $C_0$ and $V_0$ as represented by the following Expression 1. The correction parameter $C_0$ is a parameter indicating an inclination of the straight line. The correction parameter $V_0$ is a parameter indicating an intercept of the straight line with respect to the vertical axis.

$$V_{era} = F_A(T) = -C_0 \times T + V_0 \qquad \text{Expression 1}$$

When the chip temperature is measured by the temperature sensor 32, each non-volatile memory chip 31 applies the chip temperature T to the correction function $F_A(T)$ represented in Expression 1 to obtain the value of the erase voltage $V_{era}$ to be corrected. For example, when the measured temperature is $T=T_1$ ($T_1 > T_0$), the correction value of the erase voltage is obtained as $V_{era} = -C_0 \times T_1 + V_0 = V_1$. When the measured temperature is $T=T_2$ ($T_2 > T_1$), the correction value of the erase voltage is obtained as $V_{era} = -C_0 \times T_2 + V_0 = V_2$ ($<V_1$).

However, the non-volatile memory chips 31 differ in the degree to which the non-volatile memory chips are subjected to heat stress due to the difference in mounting position. Because of this influence, an appropriate correction value in accordance with the temperature may deviate from the common correction function $F_A(T)$ by different deviation amounts.

It is assumed that $P_A$ is a mounting position at which an appropriate correction value in accordance with temperature changes substantially same as the correction function $F_A(T)$, and $P_B$ is a mounting position closer to the chip including the controller than the mounting position $P_A$. It is considered that the mounting position $P_B$ receives a stronger heat stress than the mounting position $P_A$, and easiness of erasing in accordance with the temperature changes more rapidly than the mounting position $P_A$. At the mounting position $P_B$, an appropriate correction value in accordance with the temperature may have a steeper decreasing tendency with respect to the temperature.

For example, in the common correction function $F_A(T)$, the correction value of the erase voltage with respect to the temperature $T_2$ is obtained as $V_{era} = V_2$. In contrast, if the deviation amount of the erase voltage from the common correction function $F_A$ at the temperature $T_2$ (for the mounting position $P_B$) is obtained as $-\Delta V_B$ ($\Delta V_B > 0$), the appropriate correction value becomes $V_{era} = V_2 - \Delta V_B = V_{2B}$. In this case, a value of a correction parameter $C_{0B}$ to be updated can be obtained by the following Expression 2.

$$C_{0B} = (V_0 - V_{2B})/(T_2 - T_0) \qquad \text{Expression 2}$$

As a result, a correction function $F_B(T)$ to be used for correcting the erase voltage at the mounting position $P_B$ can be represented by the following Expression 3 as a function defined by the correction parameters $C_{0B}$ and $V_0$.

$$V_{era} = F_B(T) = -C_{0B} \times T + V_0 \qquad \text{Expression 3}$$

As illustrated by two-dot chain line in FIG. 5, this correction function $F_B(T)$ is a linear function whose intercept with respect to the vertical axis is the same as that of the common correction function $F_A(T)$, but whose slope is steeper.

In this case, an update amount for the correction parameter $C_0$ is $\Delta C_{0B}$ as represented in the following Expression 4, and the update amount for the correction parameter $V_0$ is zero.

$$\Delta C_{0B} = C_{0B} - C_0 \qquad \text{Expression 4}$$

It is assumed that $P_A$ is a mounting position at which an appropriate correction value in accordance with temperature changes substantially same as the correction function $F_A(T)$, and $P_C$ is a mounting position farther from the chip including the controller than the mounting position $P_A$. It is considered that the mounting position $P_C$ receives a weaker heat stress than the mounting position $P_A$, and the easiness of erasing in accordance with temperature changes more gently than the mounting position PA. At the mounting position $P_C$, an appropriate correction value in accordance with temperature may have a gradual decrease tendency with respect to temperature.

For example, in the common correction function $F_A(T)$, the correction value of the erase voltage with respect to the temperature $T_2$ is obtained as $V_{era} = V_2$. In contrast, if the deviation amount of the erase voltage from the common correction function $F_A$ at the temperature $T_2$ (for the mounting position $P_C$) is obtained as $+\Delta V_C$ ($\Delta V_C > 0$), the appropriate correction value is $V_{era} = V_2 + \Delta V_C = V_{2C}$. In this case, the value of the correction parameter $C_{0C}$ to be updated can be obtained by the following Expression 5.

$$C_{0C} = (V_0 - V_{2C})/(T_2 - T_0) \qquad \text{Expression 5}$$

As a result, a correction function $F_C(T)$ to be used for correcting the erase voltage at the mounting position $P_C$ can be represented by the following Expression 6 as a function defined by the correction parameters $C_{0C}$ and $V_0$.

$$V_{era} = F_C(T) = -C_{0C} \times T + V_0 \qquad \text{Expression 6}$$

As illustrated by one-dot chain line in FIG. 5, this correction function $F_C(T)$ is a linear function whose intercept with respect to the vertical axis is the same as that of the common correction function $F_A(T)$, but whose slope is gentler.

In this case, the update amount for the correction parameter $C_0$ is $\Delta C_{0C}$ as represented in the following Expression 7, and the update amount for the correction parameter $V_0$ is zero.

$$\Delta C_{0C} = C_{0C} - C_0 \qquad \text{Expression 7}$$

As illustrated in FIG. 5, it is understood that, when the deviation amount of the appropriate erase voltage with respect to heat stress from the common correction function $F_A$ is obtained, the correction parameter of each non-volatile memory chip 31 can be appropriately updated by obtaining the update amount for the correction parameter. For that reason, the relationship between the deviation amount of the appropriate erase voltage from the common correction function $F_A$ in accordance with the heat stress at a predetermined temperature T and the temperature information representing the heat stress is experimentally modeled and obtained as a model function. As the temperature information indicating the heat stress for a certain non-volatile memory chip, a temperature difference ΔT between the chip temperature measured in the previous data erase operation to the certain non-volatile memory chip and the chip temperature of the certain non-volatile memory chip currently measured may be used.

Figure 6A:
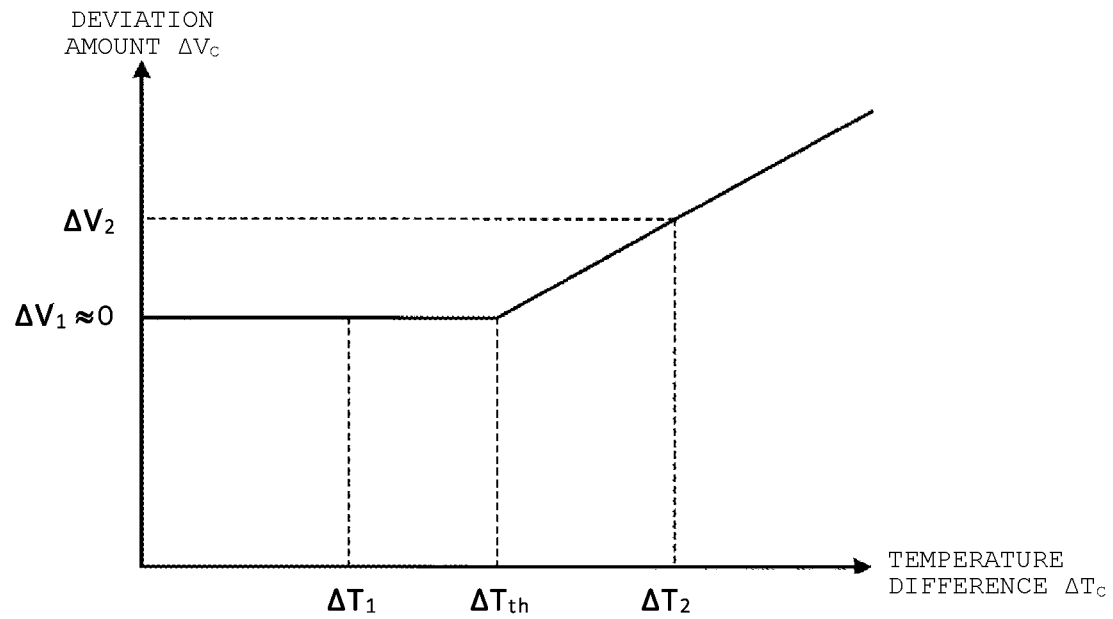
FIGS. 6A and 6B are graphs illustrating a model function used in the embodiment.

For example, when the common correction function $F_A(T)$ and the correction function $F_C(T)$ corresponding to the mounting position $P_C$, which is farther from the chip including the controller than the mounting position $P_A$, can be regarded as approximately the same for a relatively small temperature difference corresponding to the mounting position $P_C$, that is, when $\Delta V_C \approx 0$ illustrated in FIG. 5, the model function for a predetermined temperature T is determined as illustrated in FIG. 6A. In the model function illustrated in FIG. 6A, when the temperature difference $\Delta T_C$, which is the value of the temperature difference corresponding to the mounting position $P_C$, is equal to or less than a threshold $\Delta T_{th}$, the deviation amount of an appropriate correction value from the common correction function $F_A(T)$ is maintained at zero, and when the temperature difference $\Delta T_C$ exceeds the threshold $\Delta T_{th}$, the deviation amount increases linearly according to the exceeded amount of the temperature difference $\Delta T_C$. By using the model function illustrated in FIG. 6A, for the non-volatile memory chip 31 at the mounting position $P_C$, the deviation amount $\Delta V_C$ when the temperature difference $\Delta T_C$ is $\Delta T_2$ ($>\Delta T_{th}$) is obtained to be $\Delta V_2$, and the deviation amount $\Delta V_C$ when the temperature difference $\Delta T_C$ is $\Delta T_1$ ($<\Delta T_{th}$) is obtained to be $\Delta V_1 \approx 0$.

Figure 6B:
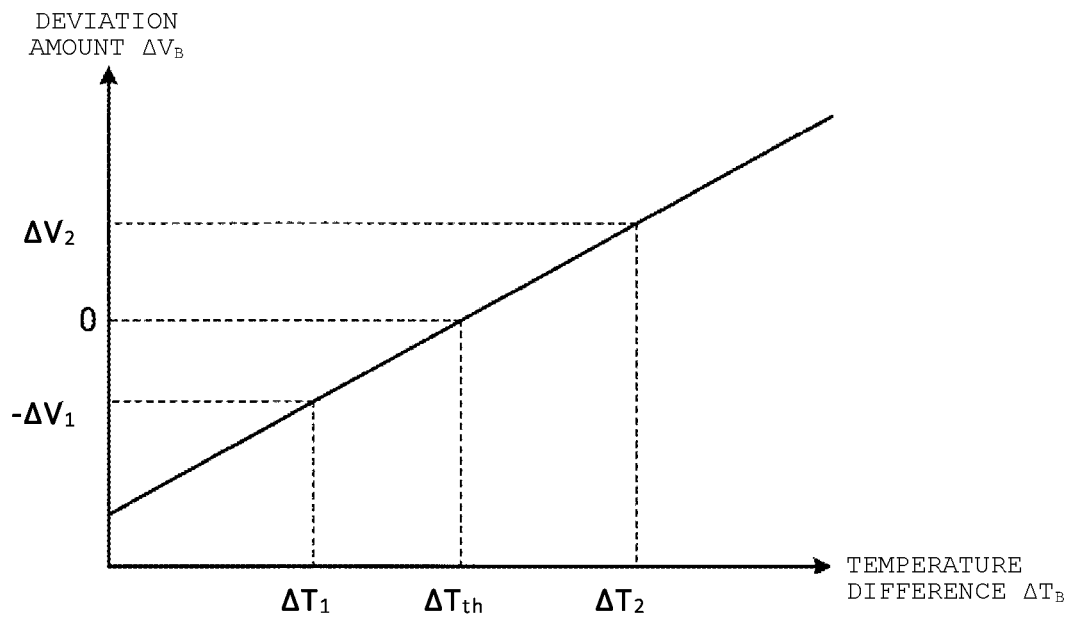

Alternatively, when the common correction function $F_A(T)$ is different from the correction function $F_B(T)$ corresponding to the mounting position $P_B$, which is closer to the chip including the controller than the mounting position $P_A$, even when the temperature difference corresponding to the mounting position $P_B$ is zero, the model function for a predetermined temperature T is determined as illustrated in FIG. 6B. In the model function illustrated in FIG. 6B, the deviation amount increases linearly according to the amount of the temperature difference $\Delta T_B$ corresponding to the mounting position $P_B$. In this model function, the deviation amount $\Delta V_B$ linearly and monotonically increases from a negative value, through zero when the temperature difference $\Delta T_B$ is the threshold $\Delta T_{th}$, and to a positive value. By using the model function illustrated in FIG. 6B, for the non-volatile memory chip 31 at the mounting position $P_B$, the deviation amount $\Delta V_B$ when the temperature difference $\Delta T_B$ is $\Delta T_2$ ($>\Delta T_{th}$) is obtained to be $\Delta V_2$, and the deviation amount $\Delta V_B$ when the temperature difference $\Delta T_B$ is $\Delta T_1$ ($<\Delta T_{th}$) is obtained to be $-\Delta V_1$.

That is, by using the model function as illustrated in FIGS. 6A and 6B, at a predetermined temperature T, the deviation amount of the appropriate correction value from the common correction function $F_A(T)$ can be obtained according to the temperature information such as the temperature difference $\Delta T$.

Figure 7:
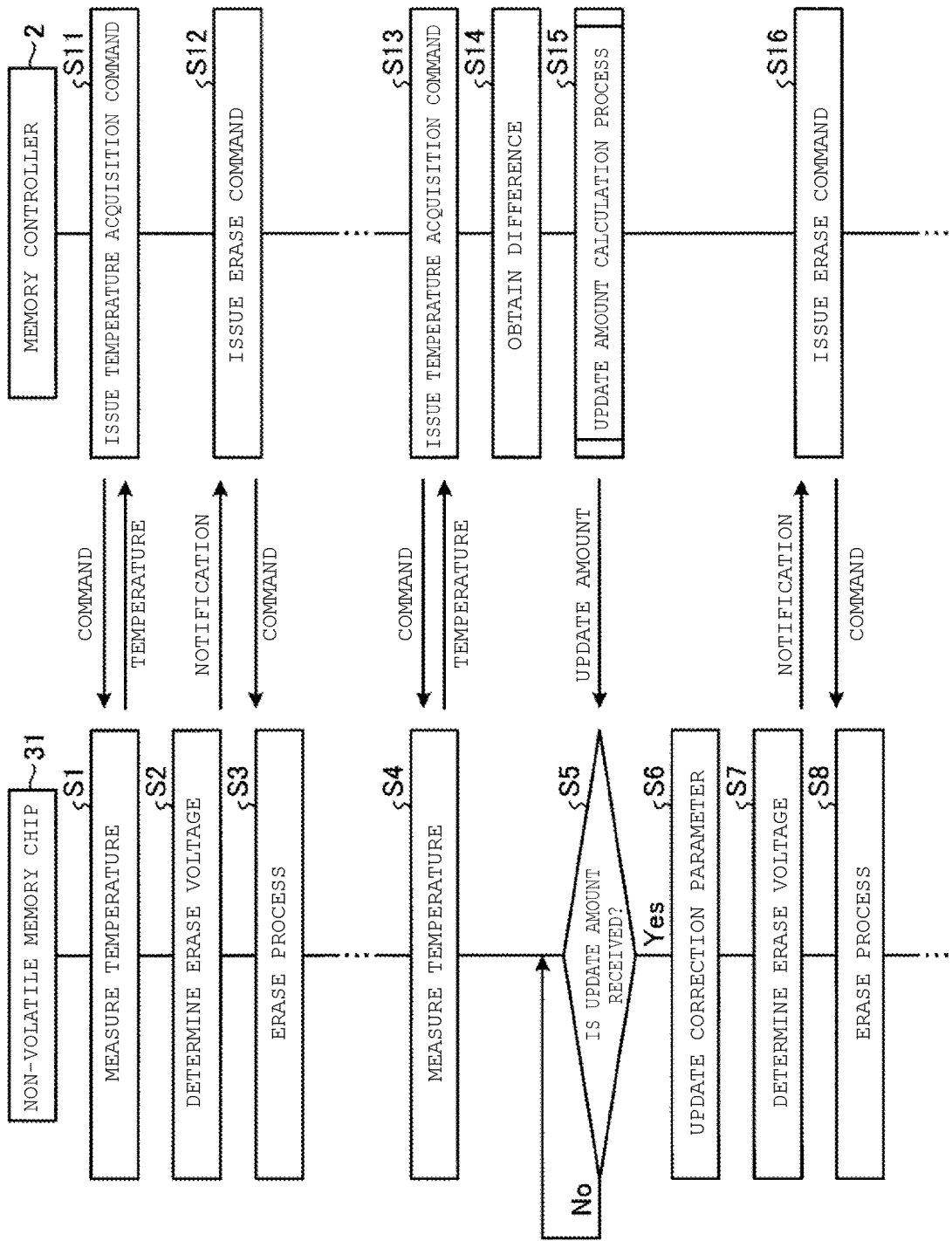
FIG. 7 is a flowchart illustrating an operation of the memory system according to the embodiment.

Next, an operation of the memory system 1 will be described with reference to FIG. 7. FIG. 7 is a flowchart illustrating the operation of the memory system 1. In FIG. 7, the operation in one non-volatile memory chip 31 and the memory controller 2 is illustrated, but the operation in the other non-volatile memory chips 31 and the memory controller 2 is also the same.

When it is time to perform an erase process for the first time in the non-volatile memory chip 31, the memory controller 2 issues a temperature acquisition command to the non-volatile memory chip 31 to acquire the temperature of the non-volatile memory chip 31 (S11). Upon receiving the temperature acquisition command, the non-volatile memory chip 31 measures chip temperature with the temperature sensor 32 (S1), stores the measured temperature in the memory, and returns a response including the measured temperature to the memory controller 2. Upon acquiring the measured temperature (S11), the memory controller 2 stores the measured temperature in association with identification information of the non-volatile memory chip 31.

The non-volatile memory chip 31 applies the measured temperature to the correction function defined by a common correction parameter (e.g., the common correction function $F_A(T)$) to determine the erase voltage (S2), and sends a notification that the determination is completed to the memory controller 2. Upon receiving the notification that the erase voltage has been determined, the memory controller 2 issues an erase command including an address of a block to be erased to the non-volatile memory chip 31 (S12). Upon receiving the erase command, the non-volatile memory chip 31 performs the erase process on the addressed block using the erase voltage determined in S2 (S3).

After that, when it is time to perform the erase process again in the non-volatile memory chip 31, the memory controller 2 issues a temperature acquisition command to the non-volatile memory chip 31 to acquire the temperature of the non-volatile memory chip 31. (S13). Upon receiving the temperature acquisition command, the non-volatile memory chip 31 measures the chip temperature with the temperature sensor 32 (S4), stores the measured temperature in the memory, and returns a response including the measured temperature to the memory controller 2. Upon acquiring the measured temperature, the memory controller 2 obtains the difference between the temperature acquired in S11 and the temperature acquired in S13 (S14), and uses the model function to perform an update amount calculation process for calculating the update amount for the correction parameter of the correction function (S15).

Figure 8A:
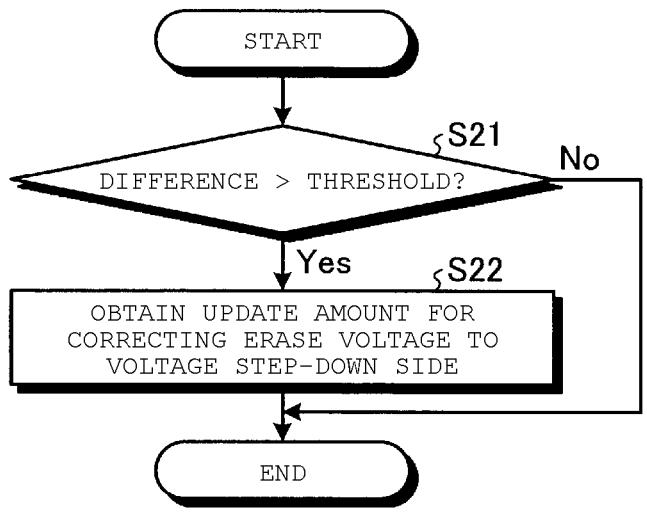
FIGS. 8A and 8B are flowcharts illustrating an update amount calculation process in a modification example of the embodiment.

For example, when the model function is the function as illustrated in FIG. 6A, the update amount calculation process (S15) may be performed as illustrated in FIG. 8A. FIG. 8A is a flowchart illustrating the update amount calculation process (S15 of FIG. 7). That is, the memory controller 2 compares the temperature difference ΔT obtained in S14 with the threshold $\Delta T_{th}$. When it is determined that the temperature difference ΔT exceeds the threshold $\Delta T_{th}$ (Yes in S21), the memory controller 2 obtains the deviation amount using the model function. For example, if the temperature difference $\Delta T_C$ obtained in S14 is $\Delta T_2$ ($>\Delta T_{th}$), the memory controller 2 applies the temperature difference $\Delta T_C = \Delta T_2$ to the model function to obtain the deviation amount $\Delta V_C = \Delta V_2$. The memory controller 2 obtains the update amount for the correction parameter for correcting the erase voltage to the voltage step-down side according to the deviation amount obtained by using the model function (S22). For example, if an appropriate correction value is $V_2 - \Delta V_C$ (which is equal to $\Delta V_2$)=$V_{2C}$ according to the deviation amount $\Delta V_C = \Delta V_2$, the update amount $\Delta C_{0C}$ of the correction parameter $C_0$ may be obtained as in Expressions 5 to 7. When it is determined that the temperature difference $\Delta T_C$ obtained in S14 is less than or equal to the threshold $\Delta T_{th}$ (No in S21), the memory controller 2 regards that the deviation amount of the appropriate correction value from the common correction function $F_A(T)$ is zero and updating of the correction parameter is unnecessary, and skips S22.

Figure 8B:
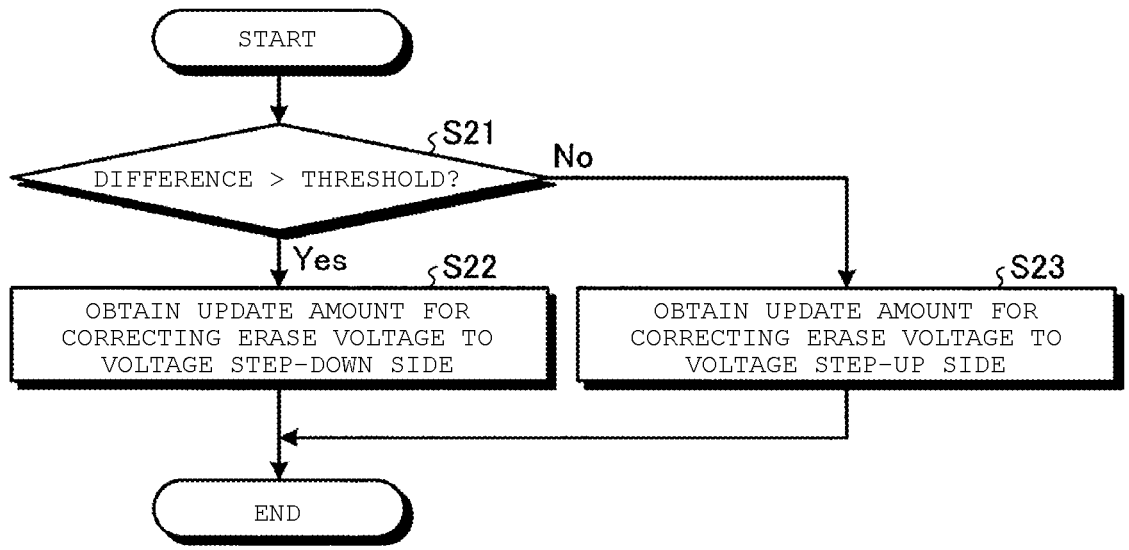

Alternatively, when the model function is the function as illustrated in FIG. 6B, the update amount calculation process (S15) may be performed as illustrated in FIG. 8B. FIG. 8B is a flowchart illustrating the update amount calculation process (S15 of FIG. 7). That is, the memory controller 2 compares the temperature difference ΔT obtained in S14 with the threshold $ΔT_{th}$.

When it is determined that the temperature difference ΔT exceeds the threshold $ΔT_{th}$ (Yes in S21), the memory controller 2 obtains the deviation amount using the model function. For example, if the temperature difference $ΔT_B$ obtained in S14 is $ΔT_2$ (>$ΔT_{th}$), the memory controller 2 applies the temperature difference $ΔT_B=ΔT_2$ to the model function to obtain the deviation amount $ΔV_B=ΔV_2$. The memory controller 2 obtains the update amount for the correction parameter for correcting the erase voltage to the voltage step-down side according to the deviation amount obtained by using the model function (S22). For example, if an appropriate correction value is $V_2−ΔV_B$ (which is equal to $ΔV_2$)=$V_{2B}$ according to the deviation amount $ΔV_B=ΔV_2$, the update amount $ΔC_{OB}$ of the correction parameter $C_0$ may be obtained as in Expressions 2 to 4.

When it is determined that the temperature difference ΔT obtained in S14 is less than or equal to the threshold $ΔT_{th}$ (No in S21), the memory controller 2 obtains the deviation amount using the model function. For example, if the temperature difference $ΔT_B$ obtained in S14 is $ΔT_1$ (<$ΔT_{th}$), the memory controller 2 applies the temperature difference $ΔT_B=ΔT_1$ to the model function to obtain the deviation amount $ΔV_B=−ΔV_1$. The memory controller 2 obtains the update amount for the correction parameter for correcting the erase voltage to the voltage step-up side according to the deviation amount obtained by using the model function (S23). For example, if an appropriate correction value is $V_2−ΔV_B$ (which is equal to −$ΔV_1$)=$ΔV_{2B}$ according to the deviation amount $ΔV_B=−ΔV_1$, the update amount $ΔC_{OB}$ of the correction parameter $C_0$ may be obtained as in Expressions 2 to 4.

Return to FIG. 7. The memory controller 2 supplies the update amount for the correction parameter obtained in the update amount calculation process (S15) to the non-volatile memory chip 31. After measuring the temperature in S4, the non-volatile memory chip 31 waits until the update amount for the correction parameter is received (S5). Upon receiving the update amount for the correction parameter (Yes in S5), the non-volatile memory chip 31 updates the correction parameter with the received update amount (S6). For example, if the update amount for the correction parameter $C_0$ is $ΔC_{OB}$, the non-volatile memory chip 31 adds the update amount $ΔC_{OB}$ to the correction parameter $C_0$ and updates the correction parameter $C_0$ to the correction parameter $C_{OB}$. If the update amount for the correction parameter $C_0$ is $ΔC_{OC}$, the non-volatile memory chip 31 adds the update amount $ΔC_{OC}$ to the correction parameter $C_0$ and updates the correction parameter $C_0$ to the correction parameter $C_{OC}$.

The non-volatile memory chip 31 applies the temperature measured in S4 to the correction function defined by the correction parameter, which is updated in S6, to determine the erase voltage (S7), and sends a notification that the determination is completed to the memory controller 2. Upon receiving the notification that the erase voltage has been determined, the memory controller 2 issues an erase command including the address of the block to be erased to the non-volatile memory chip 31 (S16). Upon receiving the erase command, the non-volatile memory chip 31 performs the erase process on the addressed block using the erase voltage determined in S7 (S8).

As described above, in the memory system 1 according to this embodiment, the memory controller 2 updates the correction parameter that defines the correction function of the non-volatile memory chip 31 according to the temperature information related to the temperature of the non-volatile memory chip 31. For example, the memory controller 2 applies the temperature difference between the chip temperature at the previous data erase operation and the current chip temperature to the model function to obtain the deviation amount from the correction function of the appropriate erase voltage value, and updates the correction parameter according to the obtained deviation amount. With this configuration, since the correction parameter of each non-volatile memory chip can be updated to an appropriate value in accordance with the temperature information (for example, heat stress) and the erase voltage can be corrected to an appropriate value, variations in the data erase operation among the non-volatile memory chips can be reduced. Accordingly, in each non-volatile memory chip of the memory system 1, it is possible to prevent significant characteristic deterioration due to erasing failure, improve robustness against temperature change, and improve reliability of the memory system.

Although the embodiment implements the control for updating the correction parameter in units of a chip, the correction parameter may be updated in units of a block in the non-volatile memory chip. Alternatively, if the erase process can be selectively performed in units smaller than the block, the correction parameter may be updated in units smaller than the block.

Instead of introducing an algorithm into the memory system 1 for determining variations in the correction value of the erase voltage of the non-volatile memory chip due to heat stress and compensating for the variations, an algorithm may be introduced into the memory system 1 for estimating a degree of the heat influence from the controller according to the mounting position and compensating for the heat influence degree.

Figure 9A:
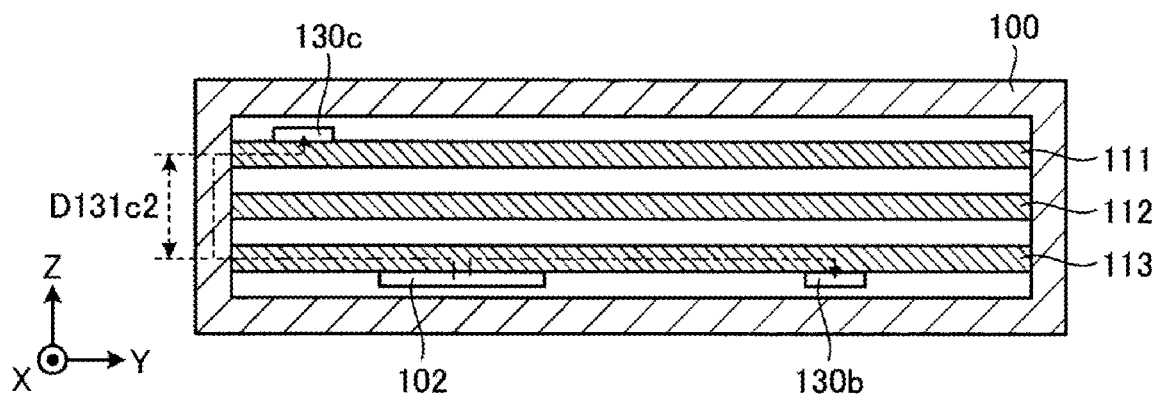
FIGS. 9A to 9C are diagrams illustrating a mounting position and a heat influence degree in the modification example of the embodiment.
Figure 9B:
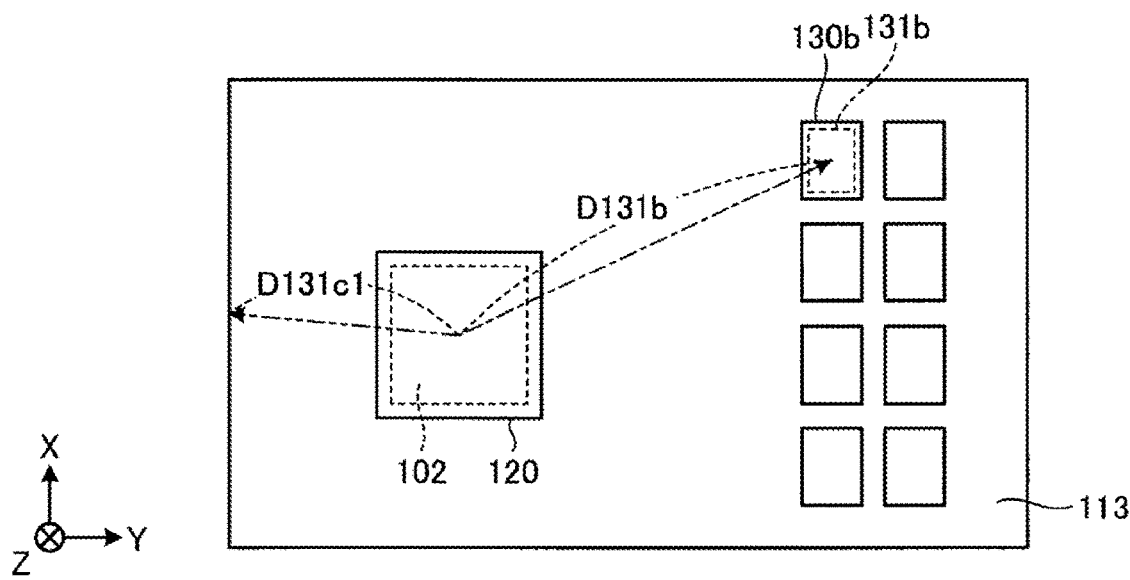
Figure 9C:
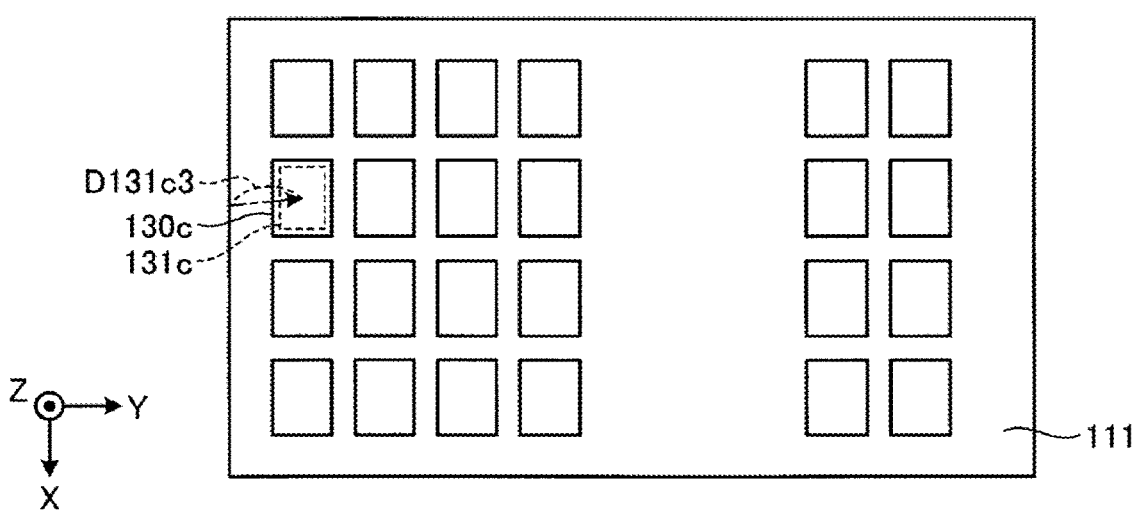

For example, the mounting position of the non-volatile memory chip in the memory system 1 and the heat influence degree may be estimated as illustrated in FIGS. 9A to 9C. FIGS. 9A to 9C are diagrams illustrating the mounting positions and the heat influence degree in the modification example of the embodiment. FIG. 9A is a cross-sectional view illustrating the mounting positions inside the memory system 1, and FIGS. 9B and 9C are plan views illustrating the mounting positions of the packages. In FIGS. 9A to 9C, the stacking direction of the boards in the memory system 1 is the Z-direction, and two directions orthogonal to each other in a plane perpendicular to the Z-direction are the X-direction and the Y-direction.

As illustrated in FIG. 9A, the memory system 1 includes a casing 100 having a flat rectangular parallelepiped shape. The memory system 1 has a plurality of circuit boards 111 to 113 in the casing 100. The circuit boards 111 to 113 are in contact with the inner surface of the casing 100. The plurality of circuit boards 111 to 113, which are stacked at intervals, are configured as a module. The module is fixed to the inner surface of the casing 100 with screws or the like. As illustrated in FIG. 9B, a package 120 that accommodates a chip 102 including the memory controller 2 and a package 130b that accommodates a non-volatile memory chip 131b are mounted, for example, on the −Z-side surface of the circuit board 113. As illustrated in FIG. 9C, a package 130c that accommodates a non-volatile memory chip 131c and the like are mounted on the +Z-side surface of the circuit board 111.

When the controller chip 102 including the memory controller 2 serves as a heat source, heat is transferred from the controller chip 102 to the non-volatile memory chip 131b mainly through the circuit board 113. For that reason, the heat influence degree from the controller chip 102 to the non-volatile memory chip 131*b* may change depending on a distance $D_{131b}$ on a plane from the controller chip 102. Assuming that a heat generation amount of the controller chip 102 is $H_0$ and a heat attenuation rate per unit distance, which varies depending on the material of the circuit board 113, is $K_{113}$, a heat influence degree $H_{131b}$ that the non-volatile memory chip 131*b* receives from the controller chip 102 can be represented by the following Expression 8.

$$H_{131b}=H_0 \times D_{131b} \times K_{113} \quad \text{Expression 8}$$

Here, the heat influence degree represented by the Expression 8 is estimated as a constant when the attenuation rate is uniform with respect to the distance from the heat source, and can also be represented as a function of distance when the attenuation rate is not uniform.

Heat is transferred from the controller chip 102 to the non-volatile memory chip 131*c* mainly through the circuit board 113, the casing 100, and the circuit board 111. For that reason, the heat influence degree from the controller chip 102 to the non-volatile memory chip 131*c* may change depending on a distance $D_{131c1}$ on a plane, a vertical distance $D_{131c2}$, and a distance $D_{131c3}$ on a plane along the transfer path of heat from the controller chip 102. Assuming that the heat generation amount of the controller chip 102 is $H_0$ and heat attenuation rates per unit distance, which varies depending on the materials of the circuit board 113, the casing 100, and the circuit board 111 are $K_{113}$, $K_{100}$, and $K_{111}$, respectively, a heat influence degree $H_{131c}$ that the non-volatile memory chip 131*c* receives from the controller chip 102 can be represented by the following Expression 9.

$$H_{131c}=H_0 \times D_{131c1} \times K_{113} \times D_{131c2} \times K_{100} \times D_{131c3} \times K_{111} \quad \text{Expression 9}$$

Figure 10A:
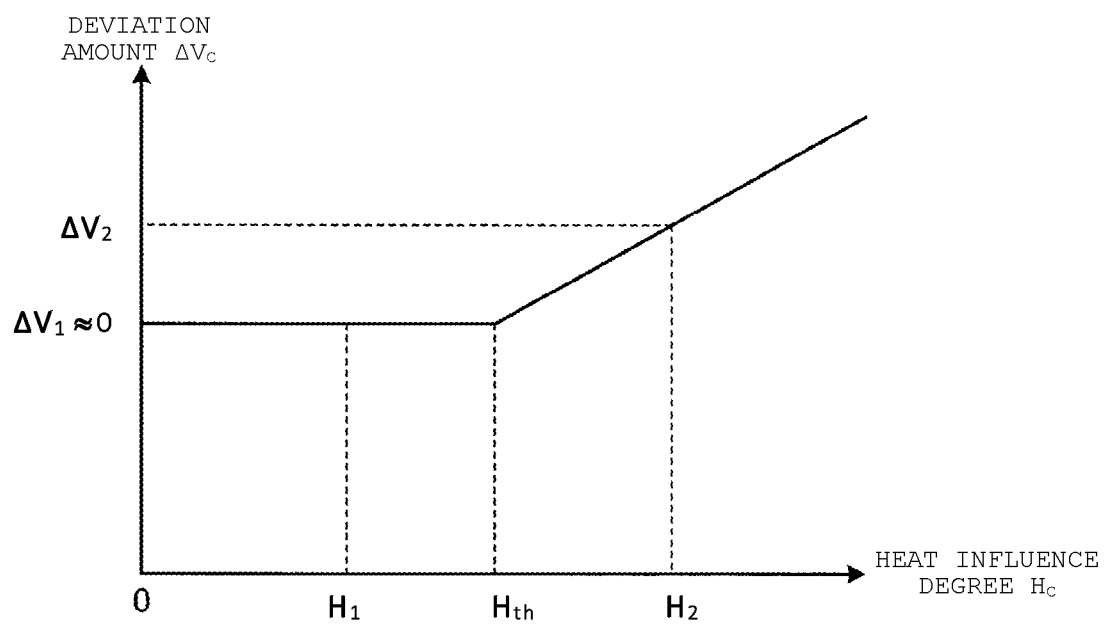
FIGS. 10A and 10B are graphs illustrating a model function used in the modification example of the embodiment.

In this case, the model function for a predetermined temperature T may be determined as illustrated in FIG. 10A. FIG. 10A is a graph illustrating a model function used in the modification example of the embodiment. In the model function illustrated in FIG. 10A, when the heat influence degree $H_C$, which is the heat influence degree corresponding to the non-volatile memory chip 131*c*, is equal to or lower than a threshold $H_{th}$, the deviation amount of the appropriate correction value from the common correction function $F_A(T)$ is maintained at zero, and when the heat influence degree $H_C$ exceeds the threshold $H_{th}$, the deviation amount increases linearly in accordance with the exceeded amount of the heat influence degree $H_C$. By using the model function illustrated in FIG. 10A, for the non-volatile memory chip 131*c* at the mounting position illustrated in FIGS. 9A and 9C, the deviation amount $\Delta V_C$ when the heat influence degree $H_C$ is $H_2$ (>$H_{th}$) is obtained to be $\Delta V_2$, and the deviation amount $\Delta V_C$ when the heat influence degree $H_C$ is $H_1$ (<$H_{th}$) is obtained to be $\Delta V_1 \approx 0$.

Figure 10B:
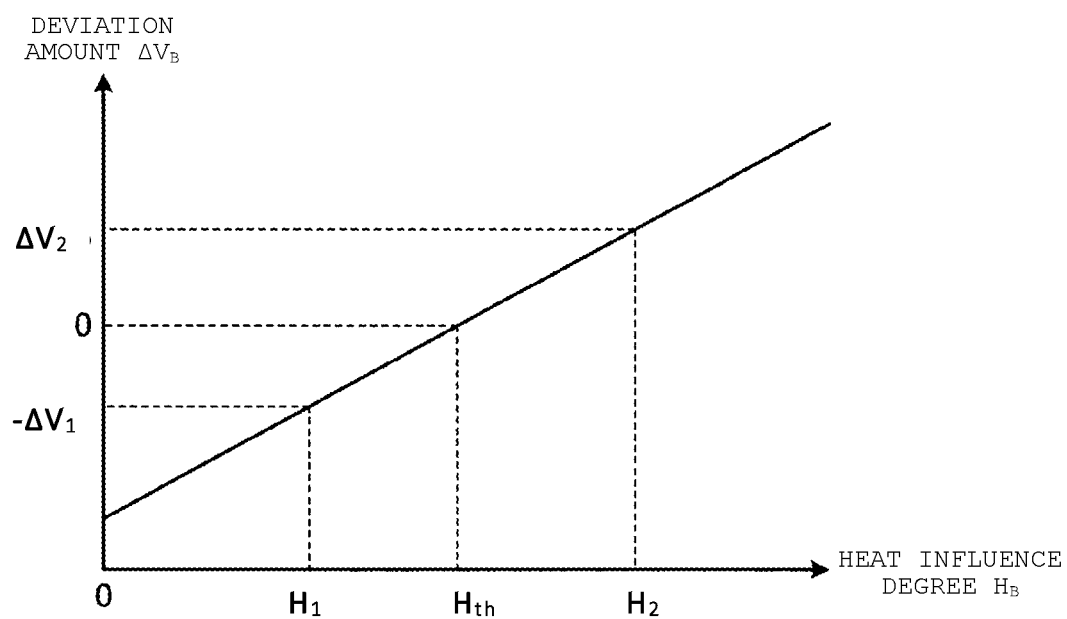

Alternatively, the model function for a predetermined temperature T may be determined as illustrated in FIG. 10B. FIG. 10B is a graph illustrating a model function used in the modification example of the embodiment. In the model function illustrated in FIG. 10B, the deviation amount increases linearly according to the amount of the heat influence degree $H_B$, which is the heat influence degree corresponding to the non-volatile memory chip 131*b*. In this model function, the deviation amount $\Delta V_B$ linearly and monotonically increases from a negative value, through zero when the heat influence degree $H_B$ is the threshold $H_{th}$, and to a positive value. By using the model function illustrated in FIG. 10B, for the non-volatile memory chip 131*b* at the mounting position illustrated in FIGS. 9A and 9B, the deviation amount $\Delta V_B$ when the heat influence degree $H_B$ is $H_2$ (>$H_{th}$) is obtained to be $\Delta V_2$, and the deviation amount $\Delta V_B$ when the heat influence degree $H_B$ is $H_1$ (<$H_{th}$) is obtained to be -$\Delta V_1$.

That is, by using the model function illustrated in FIGS. 10A and 10B, at a predetermined temperature T, the deviation amount of the appropriate correction value from the common correction function $F_A(T)$ can be obtained depending on the heat influence degree from the controller chip 102.

Figure 11:
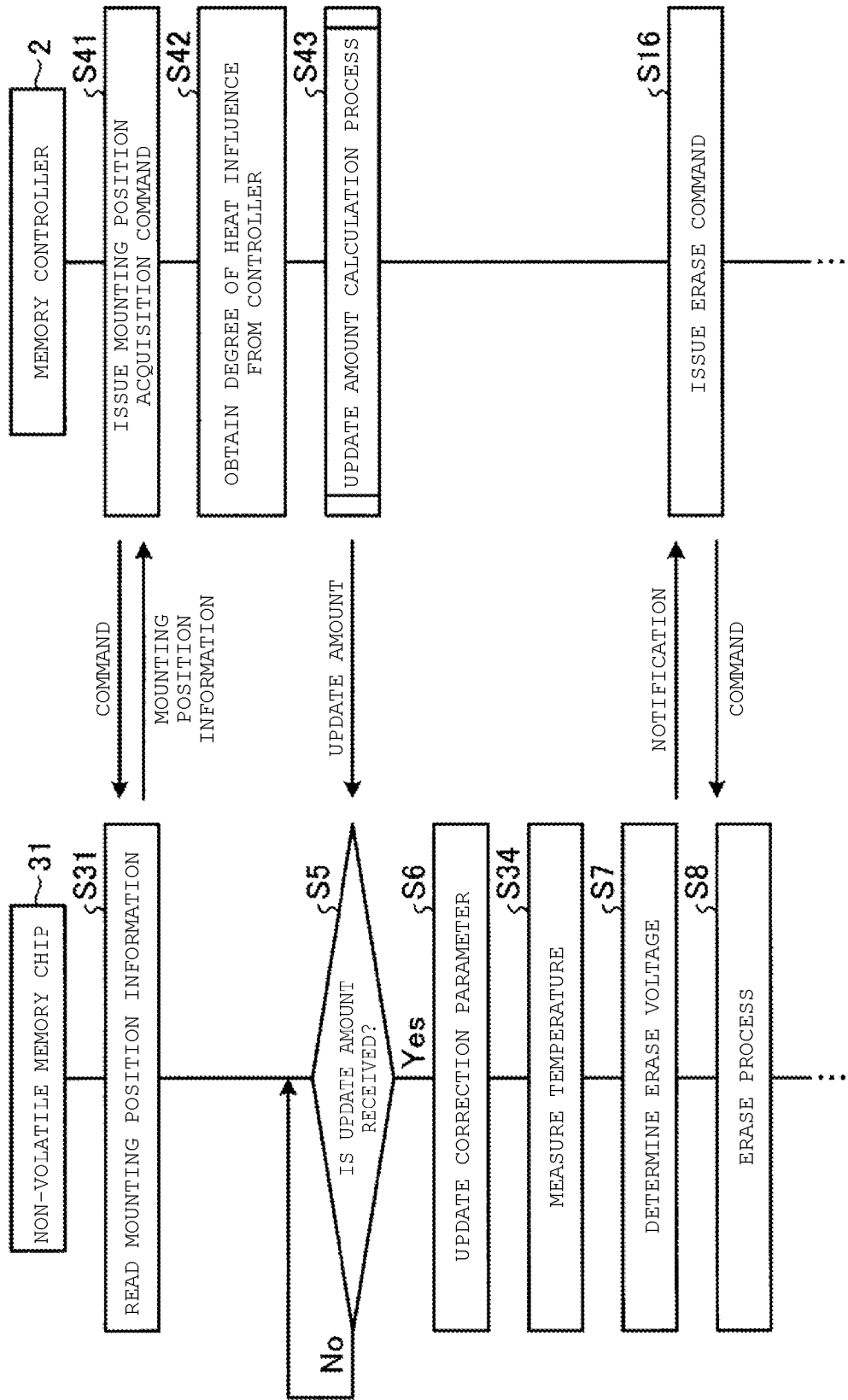
FIG. 11 is a flowchart illustrating an operation of a memory system according to the modification example of the embodiment.

As illustrated in FIG. 11, the operation of the memory system 1 of the modification example differs from that of the embodiment in the following points. FIG. 11 is a flowchart illustrating the operation of the memory system 1 according to the modification example of the embodiment.

When it is time to perform the erase process in the non-volatile memory chip 131, the memory controller 2 issues a mounting position acquisition command to the non-volatile memory chip 131 to acquire mounting position information (S41). Upon receiving the mounting position acquisition command, the non-volatile memory chip 131 reads mounting position information for example from a management information storage area provided in the cell array CA (S31), and returns the mounting position information to the memory controller 2. Upon acquiring the mounting position information (S41), the memory controller 2 specifies the mounting position of the non-volatile memory chip 131. The mounting position may be specified three-dimensionally. The memory controller 2 obtains the heat influence degree from the controller chip 102 of the non-volatile memory chip 131 according to the specified mounting position (S42), and uses the model function to perform an update amount calculation process for calculating the update amount for the correction parameter of the correction function (S43).

Figure 12A:
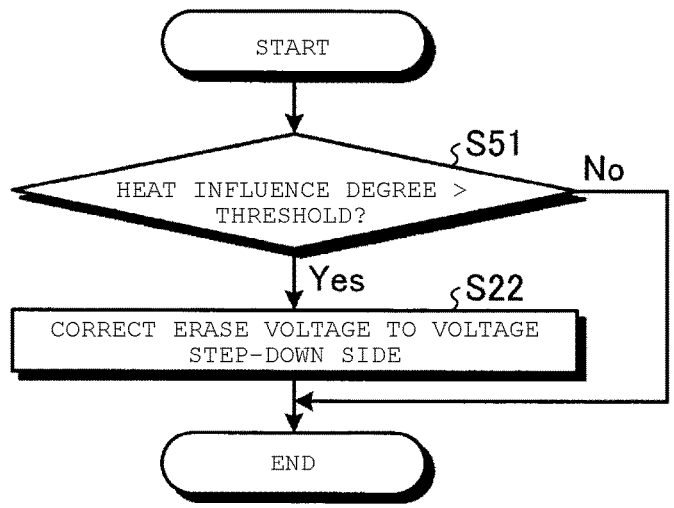
FIGS. 12A and 12B are flowcharts illustrating an update amount calculation process in the modification example of the embodiment.

For example, when the model function is the function as illustrated in FIG. 10A, the update amount calculation process (S43) may be performed as illustrated in FIG. 12A. FIG. 12A is a flowchart illustrating the update amount calculation process (S43 of FIG. 11) in the modification example of the embodiment. That is, the memory controller 2 compares the heat influence degree H obtained in S42 with the threshold $H_{th}$. When it is determined that the heat influence degree H exceeds the threshold $H_{th}$ (Yes in S51), the memory controller 2 obtains the deviation amount using the model function. For example, if the heat influence degree $H_C$ obtained in S42 is $H_2$ (>$H_{th}$), the memory controller 2 applies the heat influence degree $H_C$=$H_2$ to the model function to obtain the deviation amount $\Delta V_C$=$\Delta V_2$. The memory controller 2 obtains the update amount for the correction parameter for correcting the erase voltage to the voltage step-down side according to the deviation amount obtained by using the model function (S22). When it is determined that the heat influence degree $H_C$ obtained in S42 is equal to or less than the threshold $H_{th}$ (No in S51), the memory controller 2 regards that the deviation amount of the appropriate correction value from the common correction function $F_A(T)$ is zero and updating of the correction parameter is unnecessary, and skips S22.

Figure 12B:
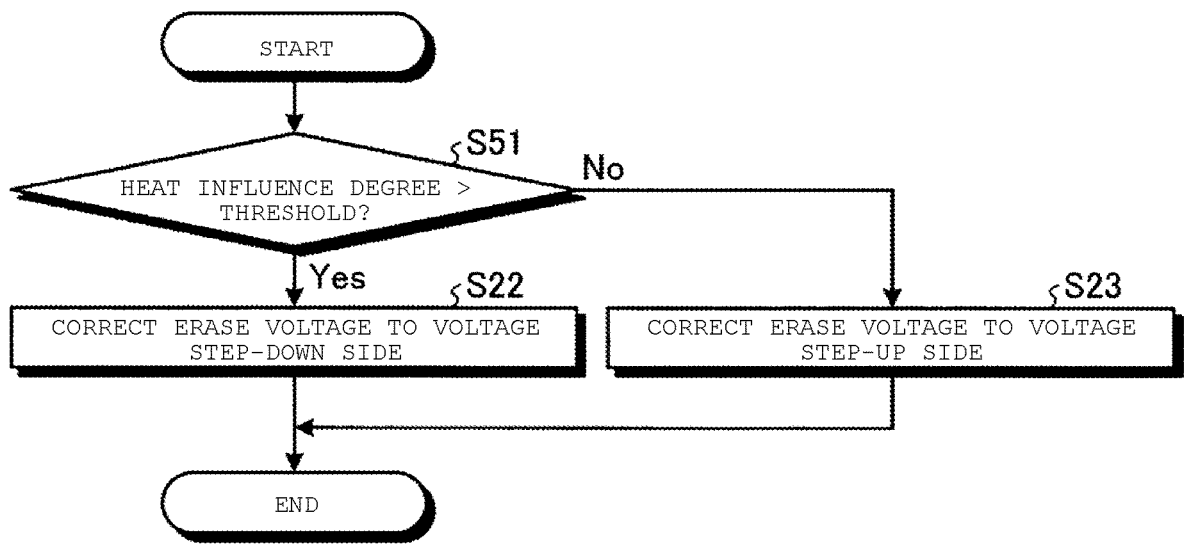

Alternatively, when the model function is the function as illustrated in FIG. 10B, the update amount calculation process (S43) may be performed as illustrated in FIG. 12B. FIG. 12B is a flowchart illustrating the update amount calculation process (S43 of FIG. 11). That is, the memory controller 2 compares the heat influence degree H obtained in S42 with the threshold $H_{th}$.

When it is determined that the heat influence degree H exceeds the threshold $H_{th}$ (Yes in S51), the memory controller 2 obtains the deviation amount using the model function. For example, if the heat influence degree $H_B$ obtained in S42 is $H_2$ (>$H_{th}$), the memory controller 2 applies the heat influence degree $H_B=H_2$ to the model function to obtain the deviation amount $\Delta V_B=\Delta V_2$. The memory controller 2 obtains the update amount for the correction parameter for correcting the erase voltage to the voltage step-down side according to the deviation amount obtained by using the model function (S22).

When it is determined that the heat influence degree H obtained in S42 is less than or equal to the threshold $H_{th}$ (No in S51), the memory controller 2 obtains the deviation amount using the model function. For example, if the heat influence degree $H_B$ obtained in S42 is $H_1$ (<$H_{th}$), the memory controller 2 applies the heat influence degree $H_B=H_1$ to the model function to obtain the deviation amount $\Delta V_B=-\Delta V_1$. The memory controller 2 obtains the update amount for the correction parameter for correcting the erase voltage to the voltage step-up side according to the deviation amount obtained by using the model function (S23).

Return to FIG. 11. The memory controller 2 supplies the update amount for the correction parameter obtained in the update amount calculation process (S43) to the non-volatile memory chip 31. Upon receiving the update amount for the correction parameter (Yes in S5), the non-volatile memory chip 31 updates the correction parameter with the received update amount (S6), and measures the chip temperature with the temperature sensor 32 (S34). The non-volatile memory chip 31 applies the temperature measured in S34 to the correction function defined by the correction parameter, which is updated in S6, to determine the erase voltage (S7), and sends a notification that the determination is completed to the memory controller 2. The subsequent steps are the same as those in the embodiment.

As described above, the correction parameter of each non-volatile memory chip can be appropriately updated by estimating the heat influence degree from the controller according to the mounting position and compensating for the heat influence degree. With this configuration, since the correction parameter of each non-volatile memory chip can be updated to an appropriate value in accordance with the heat stress and the erase voltage can be corrected to an appropriate value, variations in the data erase operation among the non-volatile memory chips can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a non-volatile memory chip capable of determining an erase voltage according to a temperature of the non-volatile memory chip and a first function defined by a correction parameter; and
a controller configured to:
apply temperature information to a second function to obtain a deviation amount of an appropriate erase voltage value obtained by the first function, the temperature information including a difference between a temperature of the non-volatile memory chip at a first timing and a temperature of the non-volatile memory chip at a second timing, the first timing being a timing at which a data erase operation has been performed on the non-volatile memory chip, the second timing being a timing subsequent to the first timing; and
update the correction parameter of the non-volatile memory chip according to the deviation amount obtained using the second function with the temperature information, wherein
the non-volatile memory chip is configured to determine the erase voltage by applying the temperature of the non-volatile memory chip to the first function that is defined by the updated correction parameter received from the controller.

2. The memory system according to claim 1, wherein the non-volatile memory chip is capable of measuring the temperature of the non-volatile memory chip, and the non-volatile memory chip is further configured to:
at the first and second timings, measure the temperature of the non-volatile memory chip, and
at the second timing, apply the measured temperature to the first function defined by the updated correction parameter received from the controller to determine the erase voltage.

3. The memory system according to claim 2, wherein when the difference is greater than a threshold, the deviation amount obtained by applying the difference to the second function increases in proportion to the difference.

4. The memory system according to claim 3, wherein when the difference is less than the threshold, the deviation amount obtained by applying the difference to the second function is zero.

5. The memory system according to claim 3, wherein when the difference is less than the threshold, the deviation amount obtained by applying the difference to the second function decreases in proportion to the difference.

6. The memory system according to claim 1, further comprising:
a board on which the non-volatile memory chip is mounted, wherein
the non-volatile memory chip is capable of measuring the temperature of the non-volatile memory chip,
the controller is further configured to:
acquire information about a mounting position of the non-volatile memory chip,
obtain a degree of heat influence from the controller to the non-volatile memory chip according to the information about the mounting position,
apply the degree of heat influence in addition to the temperature information to the second function to obtain the deviation amount, and
update the correction parameter according to the deviation amount obtained using the second function with the temperature information and the degree of heat influence, and
the non-volatile memory chip is further configured to:
measure the temperature of the non-volatile memory chip, and
apply the measured temperature to the first function defined by the updated correction parameter received from the controller to determine the erase voltage.

7. The memory system according to claim 1, wherein
the non-volatile memory chip includes a temperature sensor for measuring the temperature of the non-volatile memory chip.

8. A memory system comprising:
a plurality of non-volatile memory chips, each capable of determining an erase voltage according to a temperature thereof and a first function defined by a correction parameter; and
a controller configured to, for each of the non-volatile memory chips:
apply temperature information to a second function to obtain a deviation amount of an appropriate erase voltage value obtained by the first function, the temperature information including a difference between a temperature of the non-volatile memory chip at a first timing and a temperature of the non-volatile memory chip at a second timing, the first timing being a timing at which a data erase operation has been performed on the non-volatile memory chip, the second timing being a timing subsequent to the first timing; and
update the correction parameter of the non-volatile memory chip according to the deviation amount obtained using the second function with the temperature information, wherein
each of the non-volatile memory chips is configured to determine the erase voltage by applying the temperature thereof to the first function that is defined by the updated correction parameter received from the controller.

9. The memory system according to claim 8, wherein
each of the non-volatile memory chips is capable of measuring the temperature thereof, and
each of the non-volatile memory chips is further configured to:
at the first and second timings, measure the temperature of the non-volatile memory chip, and
at the second timing, apply the measured temperature to the first function defined by the updated correction parameter received from the controller to determine the erase voltage.

10. The memory system according to claim 9, wherein
for each of the non-volatile memory chips, when the difference is greater than a threshold, the deviation amount obtained by applying the difference to the second function increases in proportion to the difference.

11. The memory system according to claim 10, wherein
for each of the non-volatile memory chips, when the difference is less than the threshold, the deviation amount obtained by applying the difference to the second function is zero.

12. The memory system according to claim 10, wherein
for each of the non-volatile memory chips, when the difference is less than the threshold, the deviation amount obtained by applying the difference to the second function decreases in proportion to the difference.

13. The memory system according to claim 8, further comprising:
a board on which the non-volatile memory chips are mounted, wherein
each of the non-volatile memory chips is capable of measuring the temperature thereof,
the controller is further configured to:
for each of the non-volatile memory chips,
acquire information about a mounting position of the non-volatile memory chip,
obtain a degree of heat influence from the controller to the non-volatile memory chip according to the information about the mounting position,
apply the degree of heat influence in addition to the temperature information to the second function to obtain the deviation amount, and
update the correction parameter according to the deviation amount obtained using the second function with the temperature information and the degree of heat influence, and
each of the non-volatile memory chips is further configured to:
measure the temperature of the non-volatile memory chip, and
apply the measured temperature to the first function defined by the updated correction parameter received from the controller to determine the erase voltage.

14. The memory system according to claim 8, wherein
each of the non-volatile memory chips includes a temperature sensor for measuring the temperature thereof.

* * * * *